United States Patent
Nandakumar et al.

(10) Patent No.: US 8,853,042 B2
(45) Date of Patent: Oct. 7, 2014

(54) CARBON AND NITROGEN DOPING FOR SELECTED PMOS TRANSISTORS ON AN INTEGRATED CIRCUIT

(71) Applicant: Texas Instruments Incorporated, Dallas, TX (US)

(72) Inventors: Mahalingam Nandakumar, Richardson, TX (US); Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/148,840

(22) Filed: Jan. 7, 2014

(65) Prior Publication Data

US 2014/0120675 A1    May 1, 2014

Related U.S. Application Data

(62) Division of application No. 12/967,109, filed on Dec. 14, 2010.

(60) Provisional application No. 61/287,972, filed on Dec. 18, 2009.

(51) Int. Cl.

| | |
|---|---|
| H01L 21/336 | (2006.01) |
| H01L 21/8234 | (2006.01) |
| H01L 29/66 | (2006.01) |
| H01L 21/28 | (2006.01) |
| H01L 29/78 | (2006.01) |
| H01L 21/265 | (2006.01) |
| H01L 29/10 | (2006.01) |

(52) U.S. Cl.
CPC .... *H01L 21/823412* (2013.01); *H01L 29/6659* (2013.01); *H01L 21/28202* (2013.01); *H01L 21/823418* (2013.01); *H01L 29/66537* (2013.01); *H01L 29/7833* (2013.01); *H01L 21/823462* (2013.01); *H01L 21/26513* (2013.01); *H01L 29/1083* (2013.01); *H01L 21/26586* (2013.01); *H01L 21/26506* (2013.01)
USPC ............. 438/305; 438/275; 257/E21.435

(58) Field of Classification Search
None
See application file for complete search history.

(56) References Cited

U.S. PATENT DOCUMENTS

| | | |
|---|---|---|
| 5,885,861 A | 3/1999 | Gardner et al. |
| 6,830,980 B2 | 12/2004 | Mansoori et al. |
| 7,205,616 B2 | 4/2007 | Momiyama |
| 7,557,022 B2 | 7/2009 | Nandakumar et al. |
| 2005/0098774 A1 | 5/2005 | Lochtefeld et al. |
| 2006/0284249 A1 | 12/2006 | Chen et al. |
| 2007/0235817 A1 | 10/2007 | Wang et al. |
| 2008/0032512 A1 | 2/2008 | Kim et al. |
| 2008/0233693 A1 | 9/2008 | Lee et al. |
| 2010/0105185 A1 | 4/2010 | Ku et al. |
| 2010/0216288 A1 | 8/2010 | Chiu et al. |

*Primary Examiner* — Daniel Luke
(74) *Attorney, Agent, or Firm* — Jacqueline J. Garner; Frederick J. Telecky, Jr.

(57) ABSTRACT

A method of forming an integrated circuit (IC) including a core and a non-core PMOS transistor includes forming a non-core gate structure including a gate electrode on a gate dielectric and a core gate structure including a gate electrode on a gate dielectric. The gate dielectric for the non-core gate structure is at least 2 Å of equivalent oxide thickness (EOT) thicker as compared to the gate dielectric for the core gate structure. P-type lightly doped drain (PLDD) implantation including boron establishes source/drain extension regions in the substrate.

The PLDD implantation includes selective co-implanting of carbon and nitrogen into the source/drain extension region of the non-core gate structure. Source and drain implantation forms source/drain regions for the non-core and core gate structure, wherein the source/drain regions are distanced from the non-core and core gate structures further than their source/drain extension regions. Source/drain annealing is performed after source and drain implantation.

3 Claims, 5 Drawing Sheets

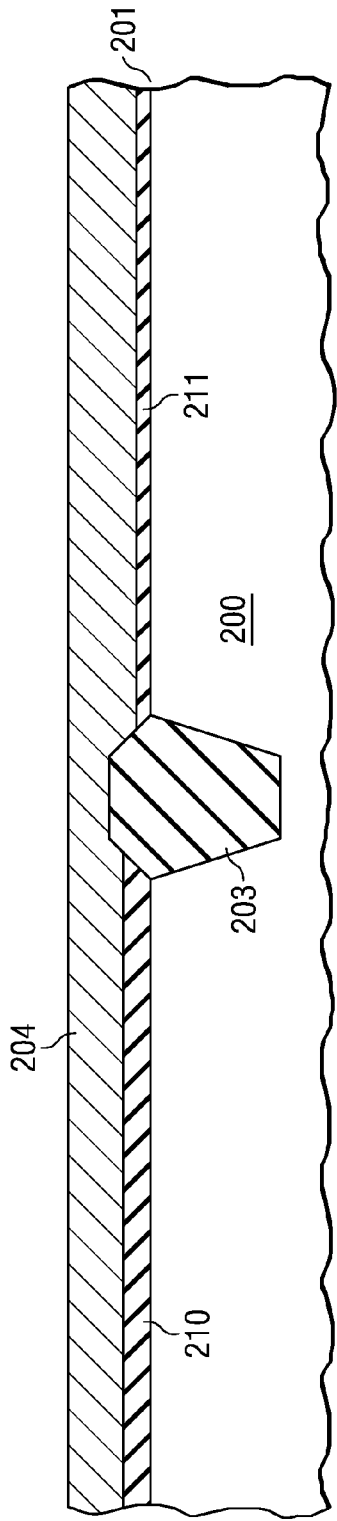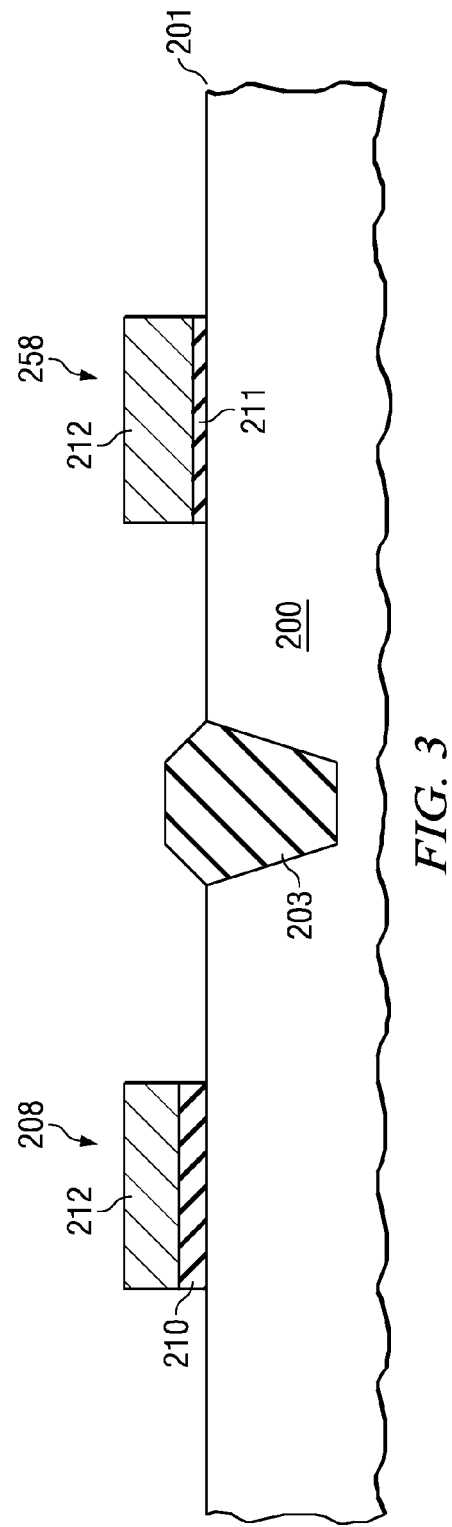

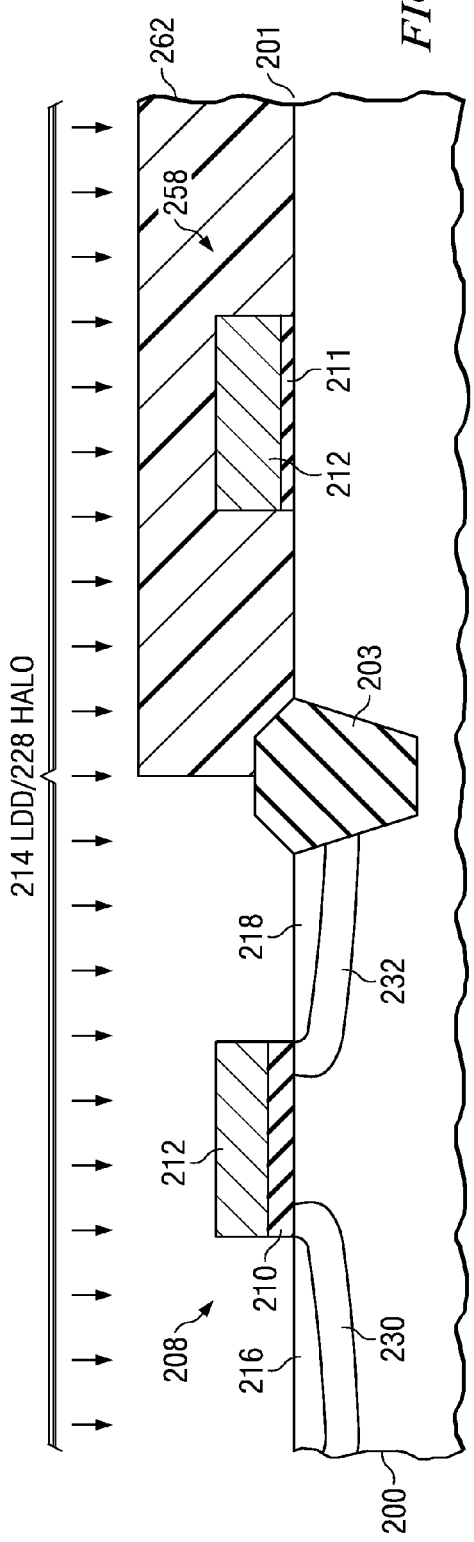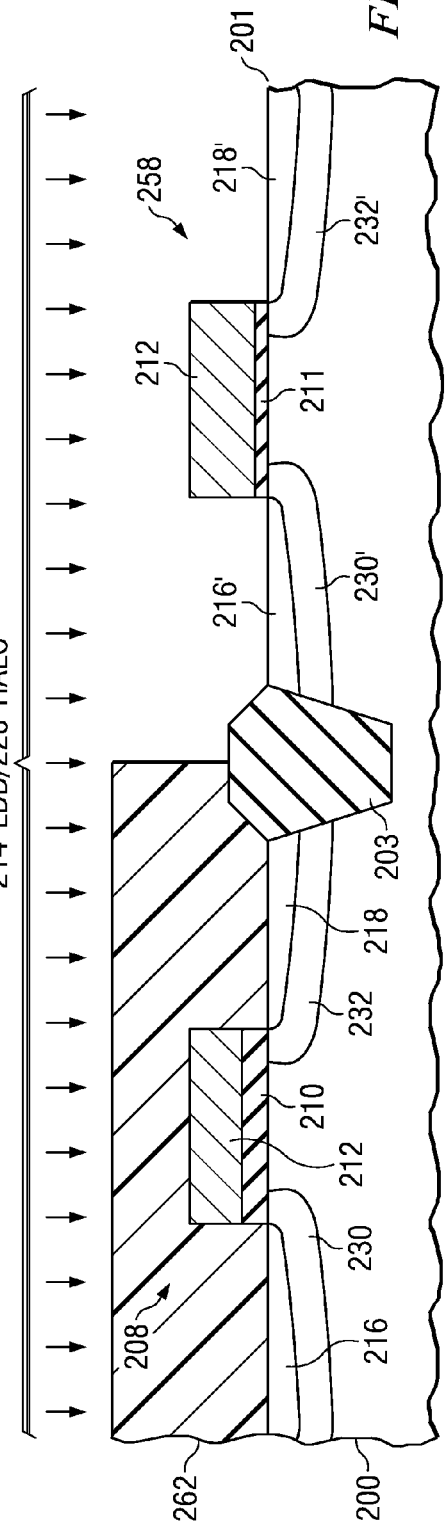

CARBON AND NITROGEN DOPING FOR SELECTED PMOS TRANSISTORS ON AN INTEGRATED CIRCUIT

CROSS REFERENCE TO RELATED APPLICATIONS

This application is a divisional of U.S. Nonprovisional patent application Ser. No. 12/967,109, filed Dec. 14, 2010, and claims the priority of U.S. provisional application Ser. No. 61/287,972 entitled "SELECTIVE AMORPHIZING INDIUM, C, N CO-IMPLANTS AT PLDD2 FOLLOWED BY LASER ANNEAL FOR IMPROVING HPIO PMOS", filed Dec. 18, 2009, which is herein incorporated by reference in its entirety.

FIELD

Disclosed embodiments relate to CMOS integrated circuits (ICs). More particularly, disclosed embodiments relate to methods for improving p-channel MOS (PMOS) transistor performance and CMOS ICs therefrom.

BACKGROUND

There is an ever increasing demand in the semiconductor industry for smaller and faster transistors to provide the functionality of the ICs used in these devices. Accordingly, in the semiconductor industry there is a continuing trend toward manufacturing ICs with higher densities. To achieve high densities, there has been and continues to be efforts toward scaling down dimensions (e.g., at submicron levels). As such, smaller feature sizes, smaller separations between features such as gate length, and more precise feature shapes are needed. This may include the width and spacing of interconnecting lines, spacing and diameter of contact holes, as well as the surface geometry of various other features (e.g., corners and edges). The scaling-down of IC dimensions can facilitate faster circuit performance and/or switching speeds, and can lead to higher effective yield in IC fabrication by providing more IC die per semiconductor wafer.

Shortening of the gate length, however, tends to raise non-conformities such as time-dependent changes in the threshold voltage due to hot carriers and degradation of mutual conductance. As one solution for the problem, MOS transistors having a so-called extension structure (a lightly doped drain (LDD structure) is known. This LDD MOS transistor structure has a pair of impurity-diffused layers which are fabricated by forming shallow source and drain extension layers, forming side walls or the like as being attached to a gate electrode, and then forming deeper source and drain regions so as to partially overlap the extension region. LDD structures can be used for both NMOS and PMOS transistors.

NMOS transistor performance in advanced CMOS integrated circuits can be enhanced by a process sequence known as the stress memorization technique (SMT), in which a layer of tensile material is deposited on the wafer after the NMOS source and drain (NSD) ion implantation process is performed and before the source/drain anneal. The SMT film may include nitride that is deposited by plasma enhanced chemical vapor deposition (PECVD), and a relatively thin oxide layer deposited under the nitride layer. An example may be that the nitride layer is about 500 Å thick and the oxide layer may then be about 100 Å thick. In the case of polysilicon gates, during the source/drain anneal, the polycrystalline silicon (poly silicon) in the NMOS gate, which became partially amorphized by the NSD ion implant, recrystallizes with a grain configuration that exerts stress on the underlying NMOS channel region when the tensile layer is removed. The resultant strain in the NMOS channel increases the mobility of the charge carriers, which improves the on-state current capability of the NMOS transistors.

However, SMT processing can degrade the performance of PMOS transistors. Degradation of PMOS transistors by SMT can occur because hydrogen in the tensile film can enhance boron diffusion in the PMOS source and drain regions which can increase short channel effects and also enhance the diffusion of boron through the PMOS gate dielectric into the channel region which can also increase short channel effects and degrade hole mobility in the channel due to increased dopant scattering. The boron penetration problem may be particularly severe for silicon oxide-based gate dielectrics that have a low concentration (e.g., <5 at. %) of nitrogen. Short channel effects increase PMOS transistor standby power which is undesirable. Moreover, SMT can increase density of interface states on the PMOS transistor causing additional hole carrier mobility degradation and reduction in on-state current capability. Although the SMT layer can be selectively removed from the PMOS transistors before source/drain anneal to avoid these detrimental effects on PMOS transistor performance, selective removal increases manufacturing cost and cycle time.

SUMMARY

One disclosed embodiment describes semiconductor fabrication to form CMOS integrated circuits (ICs) including PMOS transistors that include p-type lightly doped drain (PLDD) regions, wherein some of the PMOS transistors include selective co-implants in at least their PLDD regions comprising carbon and nitrogen and optional indium along with conventional boron, while other PMOS transistors on the IC do not receive at least one of the selective carbon and nitrogen co-implants, and ICs therefrom. One or more of the disclosed selective co-implants may also optionally be included into the PMOS source and drain regions, and/or carbon and/or nitrogen included into halo (pocket) regions if halo regions are included.

Disclosed embodiments that include polysilicon gate electrodes on the IC recognize that the disclosed co-implants may provide performance benefits (e.g., lower Rsd/higher drive current at a fixed leakage current) for certain PMOS transistor designs while providing degraded performance (larger Tox-inv/equivalent oxide thickness (EOT)), such as due to increased polysilicon depletion effects, for other PMOS transistor designs. For example, disclosed co-implants have been found to benefit the performance of certain "non-core" polysilicon gate PMOS transistors on the IC (e.g., input/output (I/O) transistors), while degrading the performance of "core" polysilicon gate PMOS transistors on the IC. For example, the core PMOS transistors may provide the PMOS transistors in the logic gates in the digital logic block(s) on the IC. As used herein the gate dielectric for the non-core PMOS transistors is at least 2 Å thicker in EOT, and is typically at least 4 Å thicker in EOT, as compared to the gate dielectric for the core PMOS transistors on the IC.

As described below, disclosed selective co-implants comprising carbon, nitrogen and optionally indium into the PLDD regions of certain PMOS transistors has been found to unexpectedly significantly increase the PMOS drive current provided at the same leakage level, while lowering the gate to drain capacitance (Cgd) by allowing higher activation levels (lowering Rds) and mitigating dopant diffusion in the PMOS transistor. Moreover, in processes including polysilicon gates and the stress memorization technique (SMT) for NMOS performance enhancement, disclosed embodiments recognize that the SMT layer can be allowed to remain on the PMOS transistors during source/drain annealing without significantly degrading the performance of PMOS transistors (e.g., mobility degradation), which allows elimination of conventional extra processing that adds to cost and cycle time that are otherwise needed to remove the SMT from the PMOS transistors before source/drain annealing to avoid PMOS performance degradation.

In another disclosed embodiment, carbon, nitrogen and indium are implanted globally so that all PMOS transistors on the IC receive the co-implant. This embodiment is particularly useful for metal gate PMOS transistors on the IC which are not subject to the polysilicon depletion effect, such as obtained by replacement gate processing of original polysilicon gate electrodes.

BRIEF DESCRIPTION OF THE DRAWINGS

FIGS. 2-7 are cross-sectional views of a substrate having a semiconductor surface, wherein core and non-core PMOS transistors are formed, according to a disclosed embodiment.

DETAILED DESCRIPTION

Figure 1:
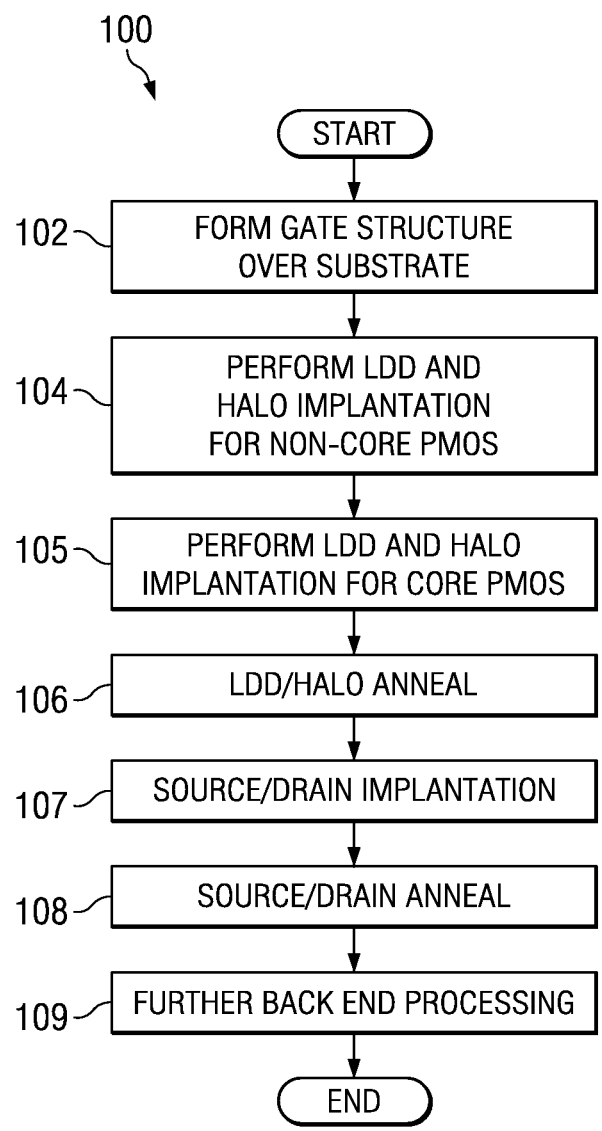
FIG. 1 is a flow diagram illustrating an example methodology for forming PMOS transistors, according to a disclosed embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

An example methodology 100 for forming PMOS transistors is illustrated in FIG. 1, while FIGS. 2-7 are cross-sectional views of a substrate 200 having a semiconductor surface 201 wherein such a methodology is implemented. Although methodology 200 is generally described below without providing processing specifics for formation of NMOS transistors, it should be appreciated that processing specific to formation of NMOS transistors is included. The methodology 100 begins at 102 wherein a gate structure is formed over a substrate 200 having a semiconductor surface 201. In particular, a layer of gate dielectric material 210 having a first thickness and a first composition is formed over some areas of the substrate surface 201, while a second gate dielectric material 211 having a second thickness and a second composition is formed over other areas of the substrate surface 201, and a gate electrode layer 204 is formed over the layers of gate dielectric materials 211 and 212 (FIG. 2). Trench isolation region 203, such as a silicon oxide filled trench, is shown.

In a process flow that forms two or more different gate material layers across the area of the substrate 200, a first oxide layer can be grown or deposited on the semiconductor surface. An etch process selectively removes the first oxide layer from selected areas. A second oxide layer is then grown or deposited to result in thicker dielectric in the non-core regions (first oxide layer+second dielectric layer) and thinner dielectric in the core regions (second dielectric layer only). A nitridation process, such a plasma or thermal nitridation, then follows to form silicon oxynitride. Due to the thicker dielectric in the non-core regions, the nitrogen concentration in the oxynitride resulting from the nitridation process in the core regions is significantly higher as compared to the non-core regions. For example, the atomic % nitrogen in the core regions can be 6 to 15%, and <5% in the non-core regions. Disclosed embodiments recognize that the low nitrogen content in the non-core oxynitride makes non-core PMOS transistors having polysilicon gate electrodes prone to boron penetration, and include adding nitrogen to the oxynitride of the non-core PMOS transistors by implantation to reduce such boron penetration.

As known in the art, in another embodiment the gate dielectric material on the substrate 200 can be formed as two or more different layers varying in thickness and/or composition across its area to allow for devices having different supply voltage tolerances (e.g., core transistors and I/O transistors). For example, in one example flow, a silicon oxide layer is grown or deposited across the full area of the substrate 200. An etch process then removes the silicon oxide layer over selected areas that later receive gate dielectric material 211, and a high-k dielectric material is then deposited globally on the substrate 200. As used herein, a "high-k" dielectric provides a k-value of ≥7.8, which is at least about twice the k-value of conventional silica. As a result, the selected areas 211 that receive gate dielectric material can have a gate dielectric that is solely the high-k material that can be used for the core transistors, while the areas 210 not etched by the etch process that receive the high-k dielectric material can have a dielectric stack comprising the high-k dielectric material on the silicon oxide layer that can be used for non-core (e.g., I/O) transistors.

The gate electrode layer 204 and the layers of gate dielectric material 210 and 211 are patterned to form gate structure 208 and gate structure 258 (FIG. 3). The gate structure 208 comprises a gate electrode 212 on a gate dielectric material 210, while gate structure 258 is shown comprising gate electrode 212 on a gate dielectric material 211, where the gate dielectric material 211 can be the same as gate dielectric material 210, or a dielectric having a different thickness and/or composition. In one embodiment, the gate dielectric material 211 for gate structure 258 is at least 2 Å thinner in EOT as compared to the EOT of gate dielectric material 210 for gate structure 208, and in some embodiments gate dielectric material 211 is 10 Å to 20 Å thinner in EOT as compared to gate dielectric material 210.

It will be appreciated that the respective layers can be patterned in any suitable manner to form the gate structures 208 and 258, such as by etching, for example. It will also be appreciated that the gate electrode layer 204 thus yields a contact area or surface that provides a means for applying a voltage to the transistor for biasing the transistor.

Further, the layers of gate dielectric material 210 and 211 and the gate electrode layer 204 can be applied to the substrate 200 in any number of ways, such as with spin-on techniques, sputtering techniques (e.g., magnetron or ion beam sputtering), growth and/or deposition techniques such as chemical vapor deposition (CVD), for example. The gate dielectric materials 210 and 211 are generally formed to a thickness of about 0.5 nm to 5 nm EOT, for example, while the gate electrode layer 204 can be formed to a thickness of about 50-500 nm, for example.

Additionally, the gate electrode layer 204 generally includes doped polysilicon, SiGe or metal, and the layers of gate dielectric material 210 and 211 can comprise a high-k or ultra high-k dielectric material, for example. A dielectric material having a k-value of about 7.8 and a thickness of about 10 nm, for example, has the same EOT and is electrically equivalent to a silicon oxide gate dielectric having a k-value of about 3.9 and a thickness of about 5 nm. The layer of gate dielectric materials 210 and 211 may include, for example, any one or more of the following, either alone or in combination: aluminum oxide ($Al_2O_3$), zirconium silicate, hafnium silicate, hafnium silicon oxynitride, hafnium oxynitride, zirconium oxynitride, zirconium silicon oxynitride, hafnium silicon nitride, lanthanum oxide ($La_2O_3$), hafnium oxide ($HfO_2$), zirconium oxide ($ZrO_2$), cerium oxide ($CeO_2$), bismuth silicon oxide ($Bi_4Si_2O_{12}$), titanium dioxide ($TiO_2$), tantalum oxide ($Ta_2O_5$), tungsten oxide ($WO_3$), yttrium oxide ($Y_2O_3$), lanthanum aluminum oxide ($LaAlO_3$), barium strontium titanate, barium strontium oxide, barium titanate, strontium titanate, $PbZrO_3$, lead scandium tantalate (PST), lead zirconium niobate (PZN), lead zirconate titanate (PZT) and lead magnesium niobate (PMN).

The substrate 200 may generally comprise any type of semiconductor body (e.g., silicon, SiGe, SOI) such as a semiconductor wafer or one or more die on a wafer, as well as any other type of semiconductor and/or epitaxial layers grown thereon and/or otherwise associated therewith. It will also be appreciated that the patterning of the gate electrode layer 204 and the layer of gate dielectric material (as with all masking and/or patterning disclosed herein) can be performed in any suitable manner, such as with lithographic techniques, for example, where lithography broadly refers to processes for transferring one or more patterns between various media. In lithography, a light sensitive resist coating is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched).

After the gate structures 208 and 258 are defined, the methodology 100 proceeds to 104 wherein an LDD implantation 214 and halo implantation 228 are performed with a common mask, for example, to form source/drain extension regions 216, 218 and halo region 230 and 232 for gate structure 208 as shown in FIG. 4, which after subsequent processing will be used to form non-core PMOS transistors. Similarly, in 105, implantation 214' forms source/drain extension regions 216', 218' and implantation 228' forms halo region 230' and 232' for gate structure 258 as shown in FIG. 5, which after subsequent processing will be used to form core PMOS transistors. It is noted that although methodology 100 is described herein implanting drain extensions and halos using the same masking level for core PMOS transistors, and a different masking level for implanting both drain extensions and halos for non-core PMOS transistors, separate masking levels can be used for implanting drain extensions and halos for both non-core and core PMOS transistors, and in the case of metal gates for gate electrodes 212, the same masking level can be used for implanting the drain extension and/or halo for both the core and non-core PMOS transistors.

It is noted that 104 and 105 can be performed in either order, so that non-core PMOS LDD/halo implantation can be performed before or after core PMOS LDD/halo implantation. Moreover, a high temperature anneal can take place between 104 and 105, such as the ultra-high temperature (UHT) anneal that is described below.

The source/drain extension regions 216, 218 include co-implanted carbon and nitrogen, along with optional indium, in addition to a boron comprising implant (B, or a molecular species such as $BF_2$ or $C_2B_{10}H_{12}$). The implant energies are such that the gate electrode 212 blocks the carbon, nitrogen and optional indium implanted at LDD implantation 214 from reaching the PMOS channel, so that the source/drain extension regions 216, 218 are formed in the substrate 200 on either side of the gate structure 208.

As shown in FIG. 4, the boron comprising implant and co-implants are selective as they are provided to gate structure 208 which after completion of methodology 200 will become a non-core PMOS transistor, but at least one of the co-implant species are not provided to gate structure 258 which after completion of methodology 200 may comprise a core PMOS transistor due to the presence of masking layer (e.g., photoresist) 262 during LDD implantation 214 and halo implantation 228 which blocks at least one of the boron comprising implant described above (B, or a molecular species such as $BF_2$ or $C_2B_{10}H_{12}$) and carbon, nitrogen (and if used indium) co-implants. In the embodiment shown in FIG. 4, masking layer 262 blocks the boron comprising implant, as well as the carbon, nitrogen and optional indium co-implant received by gate structure 208 during LDD implantation 214, as well as the halo implantation 228, from being received by gate structure 258.

Although halo implantation 228 is described herein following LDD implantation 214, halo implantation 228 can be before the LDD implantation. One or more quad high-angle implants for halo implantation 228 may be utilized, for example, to selectively locate implanted species within the substrate 200 to form the halo regions 230, 232 for gate structure 208. Similar to the LDD implantation 214, the halo regions 230, 232 can be optionally formed by co-implanting at halo implantation 228 one or more of carbon and nitrogen with dose and energy parameters described above along with at least one n-type dopant comprising arsenic, phosphorous and/or antimony.

FIG. 5 shows LDD implantation 214' and halo implantation 228' performed with a common mask using masking layer 262 to form source/drain extension regions 216', 218' and halo regions 230' and 232', respectively for gate structure 258, which after completion of methodology 200 will become a core PMOS transistor. The source/drain extension regions 216', 218' include a boron comprising specie described above (B, or a molecular species such as $BF_2$ or $C_2B_{10}H_{12}$). The boron comprising implant received by gate structure 258 is generally performed using different conditions as compared to those received by gate structure 208. Gate structure 258 can also optionally receive one or more of carbon, nitrogen and optional indium co-implants at LDD implant 214' and optional carbon and nitrogen at halo implant 228' generally using implant conditions different as compared to that received by gate structure 208 (as well as a different later through gate Vt adjust implant).

One or more quad high-angle implants 228' may be utilized, for example, to selectively locate implanted species within the substrate 200 to form the halo regions 230', 232' shown in FIG. 5. Halo regions 230', 232' include n-type dopant from implantation 228', but can exclude one or more of the carbon and nitrogen co-implants that can be applied to gate structure 208.

Figure 8:
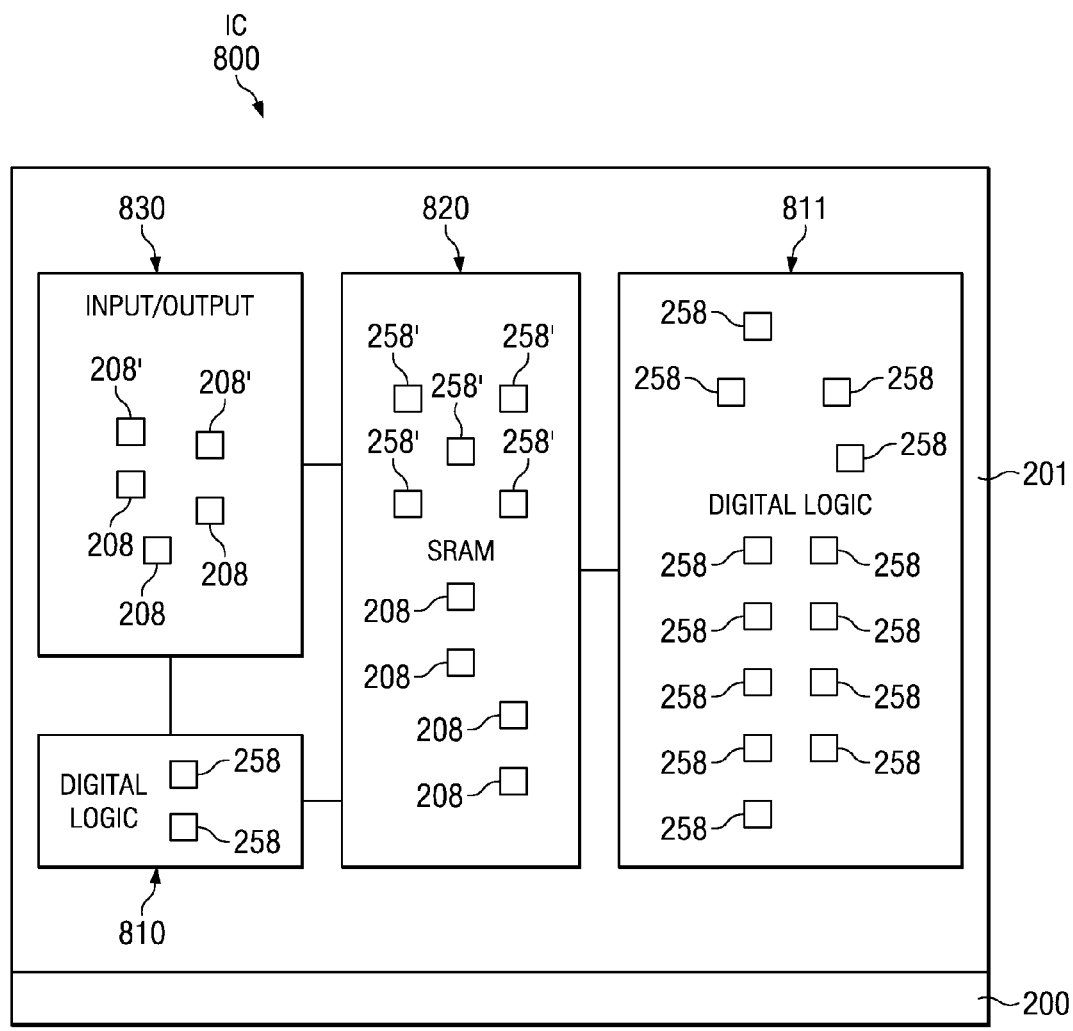
FIG. 8 is a block diagram depiction of an example IC including a plurality of functional blocks including digital logic blocks, a static ram (SRAM) block and an I/O block, where the PMOS transistors in the I/O block are non-core PMOS transistors that have carbon and nitrogen and optionally indium in their source/drain extension regions, and the digital logic blocks and at least a portion of the SRAM block have PMOS transistors that lack at least one of carbon and nitrogen and indium in their source/drain extension regions, according to a disclosed embodiment.

Disclosed embodiments can include a gate structure 208' which includes the gate dielectric material 210, and includes at least one different LDD implantation as compared to gate structure 208. For example, gate structure 208' can receive a different boron comprising implant, and in addition may not receive one or more of carbon, nitrogen and optional indium co-implants received by gate structure 208. Gate structure 208' is shown in FIG. 8 described below.

Although not shown in FIGS. 4 and 5, there can be other PMOS transistors having (the thinner) gate dielectric material 211 which can receive all the drain extension implants received by gate structure 208. Such transistors are shown in FIG. 8 described below as being based on gate structure 258'.

As described above, disclosed embodiments recognize that the low nitrogen content in the case of non-core oxynitride gate dielectric makes non-core PMOS transistors having polysilicon gate electrodes 212 prone to boron penetration, and include adding nitrogen to the oxynitride of the non-core PMOS transistors by implantation has been found to reduce such boron penetration. More specifically, adding nitrogen to the interface to increase the nitrogen concentration at least one order of magnitude at the interface between the gate electrode 212 and gate dielectric 210 for gate structure 208 when the gate dielectric comprises low % nitrogen silicon oxynitride and the gate electrode 212 comprises polysilicon has been found to suppress boron diffusion through the gate dielectric 210 and reduce mobility degradation due to SMT processing when the process flow includes SMT processing.

As known in the art, in various IC designs, such as digital signal processors (DSPs) and digital to analog converters (DACs), there are at least two sets of power supplies that provide different power supply levels to different parts of the IC, along with MOS transistors that are fabricated differently to tolerate different voltage levels. "Core" transistors are generally used for logic gates (Boolean logic gates (i.e., AND, OR, NOT, XOR, XNOR) on the IC and typically comprises the smallest geometry devices and include the thinnest gate dielectric (in terms of equivalent oxide thickness (EOT)) for the fastest operation, that need a relatively low power supply voltage to avoid breakdown. Non-core transistors, such as input/output (I/O) transistors, are designed to interact with external devices and typically comprise larger geometry devices that include a thicker gate dielectric for operation at higher voltages as compared to the core transistors on the IC. The I/O transistors may sustain higher voltages (e.g., 1.2-10 volts), such as 1.8 volts, 2.5 volts or 3.3 volts and have a threshold voltage of about 0.2 to 1.0 volts, whereas the core transistors may sustain up to only 1.4 volt and their threshold voltages may be about 0.1 to 0.5 volt. As noted above, used herein the gate dielectric for non-core PMOS transistors (e.g., PMOS I/O transistors) have a gate dielectric that is at least 2 Å thicker in EOT, and typically at least 4 Å thicker in EOT, as compared to the core PMOS transistors on the IC.

All selective co-doping implants described herein provide concentrations that are well above the background concentration of the respective species in the substrate materials, with each co-implant providing a minimum peak concentration on the finished IC of $>1\times10^{16}$ cm$^3$. To form the source/drain extension regions, carbon may be co-implanted at a dose between $5\times10^{13}$/cm$^2$ and $3\times10^{15}$/cm$^2$ at an energy from 1 keV to 20 keV. Carbon can be implanted at tilt angles between 0 to 60 deg (typically 0 to 30 deg) with multiple wafer/implant beam rotations (typically 0 to 4). The twist angle for each rotation can be 0 to 360 deg. It can be appreciated by one skilled in the art that combinations of carbon co-implants with multiple doses/energies/tilt angles/rotations can be used. Carbon has been found to suppress the diffusion of boron and indium to make the LDD profile more abrupt to lower Rsd, and also can assist with indium activation.

Nitrogen may be co-implanted at a dose between $5\times10^{13}$/cm$^2$ and $5\times10^{15}$/cm$^2$ at an energy from 5 keV to 35 keV, which as noted above can be used reduce mobility degradation caused by SMT processing for PMOS transistors comprising polysilicon gate electrodes 212 on low % nitrogen silicon oxynitride gate dielectrics 210. Nitrogen can be implanted at tilt angles between 0 to 60 deg (typically 0 to 30 deg) with multiple wafer/implant beam rotations (typically 0 to 4). The twist angle for each rotation can be 0 to 360 deg. It can be appreciated by one skilled in the art that combinations of nitrogen co-implants with multiple doses/energies/tilt angles/rotations can be used.

Regarding gate structure 208, when the gate electrode 212 comprises polysilicon and the gate dielectric 210 comprises low % nitrogen silicon oxynitride defined herein as silicon oxynitride having between 0.1 atomic % and 5 atomic % nitrogen, such as for certain ICs having PMOS I/O transistors, the nitrogen implant energy can be selected so that a significant concentration of nitrogen as implanted is provided to the interface between the gate electrode 212 and gate dielectric 210, but not too much so that a measurable threshold voltage shift and/or mobility degradation would result. For example, the nitrogen implant energy can be selected so that its projected range (Rp) in polysilicon is within 2 to 4 straggles (ΔRp), typically 3 ΔRp of the interface between the gate electrode 212 and gate dielectric 210. For typical disclosed nitrogen implant doses of between $5\times10^{13}$/cm$^2$ to $5\times10^{15}$/cm$^2$, the resulting nitrogen concentration at the gate electrode/gate dielectric interface as implanted between the gate electrode 212 and gate dielectric 210 will generally be $\geq 1\times10^{16}$/cm$^3$, and $\geq 1\times10^{18}$/cm$^3$ in some embodiments. After annealing (e.g., LDD/halo anneal 106, source/drain anneal 108 described below) the nitrogen implant, the nitrogen concentration at the interface between the gate electrode 212 and gate dielectric 210 can be one or two orders of magnitude higher as compared to the nitrogen concentration at this interface as implanted.

Nitrogen concentration enhancement at the oxynitride/gate electrode interface by implant has been recognized by disclosed embodiment to reduce or eliminate boron penetration particularly for low nitrogen content oxynitrides, such as for non-core dielectrics 210 for gate structure 208 as described above. However, disclosed embodiments recognize nitrogen concentration enhancement at the oxynitride/gate electrode can degrade core performance by introducing measurable poly depletion effects when the gate electrodes comprise polysilicon.

Disclosed embodiments also recognize that carbon together with nitrogen in the PMOS drain or drain extension regions can suppress boron diffusion to allow sharpener junctions that provide better performance. As noted above, for PMOS transistors having oxynitride gate dielectrics and polysilicon gates this benefit is available to non-core PMOS transistors without significant polysilicon depletion effects.

Indium may be co-implanted at a dose between $5\times10^{13}$/cm$^2$ and $1\times10^{15}$/cm$^2$ at an energy from 5 keV to 40 keV. Indium LDD co-implants have been discovered by the Inventors herein when used within disclosed implant parameters to create a PMOS flatband shift which allows lower channel doping and improved performance, and a Cgd reduction while maintaining Rsd & Ids-Ioff. Indium can be implanted at tilt angles between 0 to 60 deg (typically 0 to 30 deg) with multiple wafer/implant beam rotations (typically 0 to 4). The twist angle for each rotation can be 0 to 360 deg. It can be appreciated by one skilled in the art that combinations of indium co-implants with multiple doses/energies/tilt angles/rotations can be used.

The boron comprising implants 214 and 214' at steps 104 and 105, respectively, may be at 0.1 keV to 8 keV $^{11}$B equivalent energy (e.g. $^{11}$BF$_2$ at 0.5 keV to 17.8 keV) in a dose range between $5 \times 10^{13}$/cm$^2$ and $5 \times 10^{15}$/cm$^2$. It will be appreciated that the implant conditions for boron comprising implant 214 and 214' may be different.

For the n-type halo implant for implantations 228 and 228', the dose can be from between $5 \times 10^{12}$/cm$^2$ and $5 \times 10^{14}$/cm$^2$, at an energy from 5 keV to 50 keV for phosphorous, 10 keV to 75 keV for arsenic, and 30 keV to 150 keV for antimony. In addition to using angled implants, implanted species are selectively directed into the substrate 200 by virtue of the gate structures 208 and 258 and optional sidewall spacers (not shown) formed on the sides of the gate structures 208 and 258 which block some of the implanted species. It will be appreciated that the implant conditions for the n-type halo implantation 228 and 228'' may be different.

Figure 6:
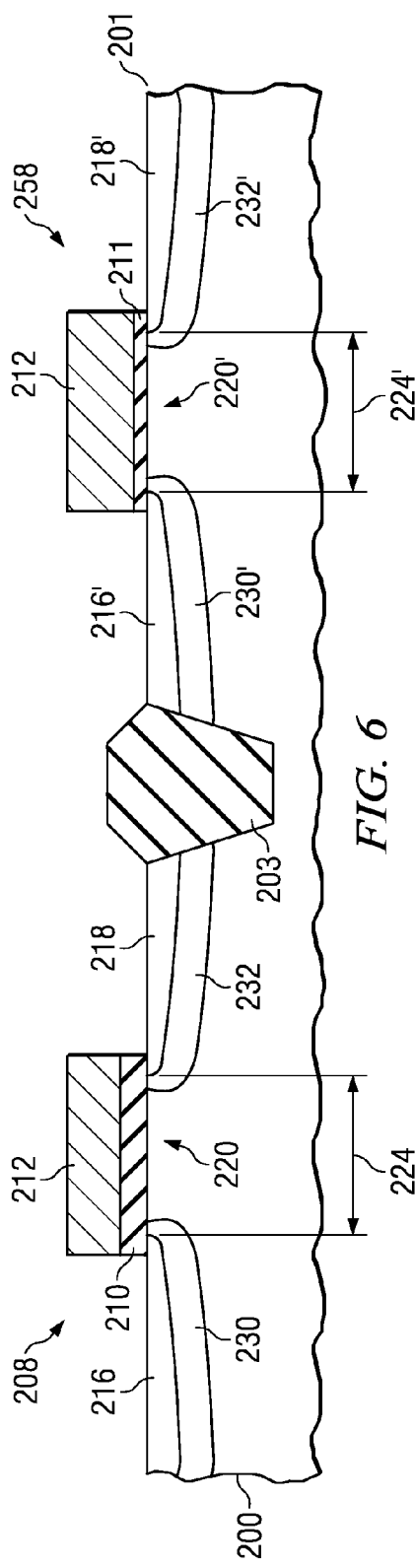

Additionally, although not shown, the source/drain extension regions 216, 218 and 216', 218' and halo regions 230, 232 and 230' and 232' may be formed after thin sidewall spacers (not shown) are formed on either side of the gate structures 208 and 258. Following LDD and halo implantations, methodology 200 can include a LDD/halo anneal 106 so that the implanted species migrate laterally into a channel regions 220 and 220' located under the gate structures 208 and 258, respectively (FIG. 6). The LDD/halo anneal 106 may comprise an ultra-high temperature (UHT) anneal.

As used herein, an UHT anneal comprises annealing conditions that provide a peak anneal temperature of between 1050° C. and 1400° C. and an anneal time at the peak temperature of generally ≤10 seconds, and typically <1 second. The combination of a UHT and carbon has been found to allow a higher level of indium activation as compared to conventionally annealing processes. The UHT annealing generally comprises a rapid thermal anneal (RTA), flash lamp anneal, or laser anneal. In one embodiment the laser or flash lamp anneal may be followed by a non-melt spike anneal. The spike anneal can comprise an RTA or a laser anneal. In the case of a laser anneal, the time can be <10 msec, such as between about 0.1 msec and 10 msec. In one embodiment the annealing comprises a 1000° C. to 1150° C. RTA spike anneal and a laser anneal at 1100° C. to 1300° C. for <10 msec. The RTA spike anneal and a laser anneal can be performed in either order.

By way of example, if the channel region 220 for gate structure 208 has a channel length 224 and the channel region 220' for gate structure 258 has a channel length 224', the source/drain extension regions 216, 218 and 216', 218' may extend under a significant portion of the channel length 224 and 224' on either side of the gate structures 208 and 258. Further, as described above the LDD implantations 214 and 214' can be angled with one or more rotations and/or twists relative to a mechanical surface of the substrate 200 and/or to a lattice structure of the substrate 200 to achieve desired doping, such as to implant the implanted species under at least a portion of an existing structure (e.g., the gate structures 208 and 258) on the substrate 200, for example.

Figure 7:
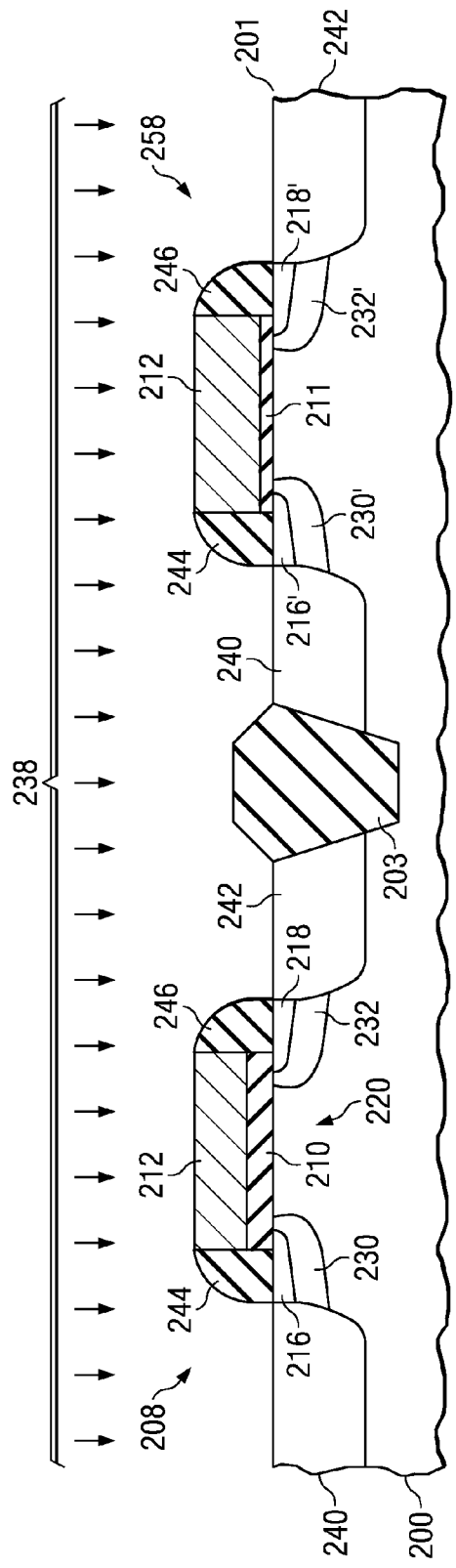

Then, at 107, source and drain implants 238 are performed to form source/drain regions 240, 242 in the substrate 200 (FIG. 7). The source/drain regions 240, 242 can be seen to be significantly deeper as compared to the source/drain extension regions 216, 218 and 216', 218'. Sidewall spacers 244, 246 are formed on either side of the gate structures 208 and 258 to direct implanted species into select locations within the substrate 200, such that the source/drain regions 240, 242 are distanced from the gate structures 208 and 258 further than the source/drain extension regions 216, 218 and 216', 218'. The sidewall spacers generally comprise a dielectric material such an oxide and/or nitride based materials, for example. Similar to the previous LDD implantation 214 described above, the source/drain regions 240, 242 can be formed by co-implanting carbon, and nitrogen and optionally indium, together with implanting a boron comprising species such as boron or a molecular boron species. Source and drain implants 238 are generally performed after the spacer formation.

To form the source/drain regions 240, 242, a boron comprising implant at a dose between about $1 \times 10^{15}$/cm$^2$ and about $2 \times 10^{16}$/cm$^2$ at an energy of 5 to 20 keV for B may be used, for example. An optional co-implant comprising one or more of carbon, nitrogen and indium may be applied to gate structure 208 using the respective dose and energy ranges described for LDD implant 214. Once the source/drain regions 240, 242 are implanted, the methodology 100 advances to 108, comprising a source/drain anneal, that can be used to provide activation for sources/drains for both PMOS and NMOS transistors. The source/drain anneal 108 can comprise an UHT anneal and/or as described above a UHT can be included after LDD implant and/or after halo implant. Moreover, in one flow, in addition to a UHT after LDD implant and/or after halo implant, there can be PMOS source/drain implantation, a UHT anneal, NMOS source/drain implantation followed by another UHT anneal.

In polysilicon gate CMOS processes including SMT for NMOS performance enhancement, the disclosed carbon and nitrogen co-implants have been found allow the SMT layer to remain on the PMOS transistors during source/drain anneal without significantly degrading the performance of PMOS transistors for ICs having PMOS transistors, which can allow elimination of conventional extra processing otherwise needed to remove the SMT from the PMOS transistors before the source/drain anneal. In one process flow, the SMT layer is stripped following the source/drain anneal 108, such as a non-melt spike RTA anneal (e.g. 1040° C.), followed by a UHT anneal at least 1150° C., such as a laser anneal for <20 msec.

Disclosed embodiments also include replacement gates for at least one of the PMOS transistors and the NMOS transistors on the IC. The original gate electrodes 212, such as polysilicon gate electrodes, for at least one of the PMOS transistors and the NMOS transistors can be removed following source/drain anneal 108 to form trenches using a suitable etch process. In one embodiment, at least a portion of the gate dielectric layer can be preserved in the etch process, such as ≥95% of the pre-etch gate dielectric thickness. The respective gate dielectric material 210 and 211 may also be stripped and re-formed in the replacement gate flow, such as using a high-k dielectric. Metal replacement gate electrodes can then be formed in the trenches over the gate dielectric material, so that reference 212 in FIG. 7 can comprise metal gates for gate structures 208 and 258 and the gate dielectric materials 210 and 211 can comprise high-k dielectrics. The metal comprising replacement gate material can comprise hafnium, zirconium, tungsten, titanium, tantalum, aluminum, a metal carbide, ruthenium, palladium, platinum, cobalt, nickel, or an electrically conductive metal oxide. As known in the art, if replacement metal gates are formed for both the PMOS and NMOS transistors, the replacement gate metal for the PMOS and NMOS transistors is generally different based on work function considerations.

Methodology 100 then advances to 109, and ends thereafter, wherein further back end processing can be performed at 109, including back end of the line (BEOL) processing including silicide and contact formation and the formation and/or patterning of one and typically a plurality of metal and dielectric layers.

FIG. 8 is a block diagram depiction of an example IC 800 including a plurality of functional blocks including digital logic blocks 810 and 811, a static ram (SRAM) block 820 and an I/O block 830. IC 800 is shown including a substrate 200 having a semiconductor surface 201. The PMOS transistors in the digital logic blocks 810 and 811 include core PMOS transistors shown as gate structure 258 that exclude at least one of the carbon, nitrogen and optional indium provided to gate structure 208 in their source/drain extension regions. SRAM block 820 is shown including non-core PMOS transistors shown as gate structure 208 and core PMOS transistors shown as gate structure 258'. As described above, core PMOS transistors based on gate structure 258' have core gate dielectric material 211 and can receive all the drain extension implants received by gate structure 208. The PMOS transistors in I/O block 830 are shown as including transistors based on both gate structure 208 and gate structure 208' that as described above has the non-core gate dielectric material 210 and excludes at least one of the carbon, nitrogen and optional indium co-doping provided to gate structure 208 in their source/drain extension regions. It will be apparent to one skilled in the art that the transistors in the respective blocks (digital logic blocks 810 and 811, SRAM 820, and I/O 830) can have different widths, lengths and threshold voltage implant adjusts.

Experiments were performed to measure the performance of non-core (e.g., I/O) PMOS transistors that received disclosed co-implanted carbon, nitrogen and indium in their drain extension regions as compared to otherwise equivalent baseline (BL) PMOS non-core transistors. All PMOS transistors had a polysilicon gate 100 nm thick, and the BL core PMOS transistors had a silicon oxynitride gate dielectric formed by plasma nitridizing a thin silicon oxide dielectric to provide a gate dielectric having about a 12 Å EOT, while the disclosed and BL non-core PMOS transistors had a low % nitrogen silicon oxynitride gate dielectric formed by the same plasma nitridizing a silicon oxide layer that was significantly thicker as compared to the silicon oxide layer nitridized to form the core gate dielectrics to provide a silicon oxynitride dielectric having about a 30 Å EOT thickness.

The implant conditions for the disclosed PMOS non-core transistors comprised indium @ $2 \times 10^{14}/cm^2$ at 12 keV, carbon @ $2 \times 10^{14}/cm^2$ at 5 keV and nitrogen @ $1 \times 10^{15}/cm^2$ at 16 keV. The BL and disclosed PMOS non-core transistors received a PLDD $BF_2$ implant @ $1.5 \times 10^{15}/cm^2$ at 4 keV, a source/drain $^{11}B$ implant of $7 \times 10^{15}/cm^2$ at 3 keV, and a UHT laser anneal of 1175° C. for 10 msec.

Electrical measurements performed revealed the non-core PMOS transistors having the co-implanted carbon, nitrogen and indium in their drain extension regions provided about a 12% increase in drive current at the same leakage level as compared to the BL PMOS non-core transistors, together with $C_{gd}$ being about unchanged as compared to the BL PMOS non-core transistor. Other tests and measurements performed revealed the non-core PMOS transistors having the co-implanted carbon, nitrogen (no optional indium) in its source/drain extension regions provided about a 8 to 10% increase in drive current at the same leakage level as compared to the BL PMOS non-core transistors, together with $C_{gd}$ being about unchanged as compared to the BL PMOS transistors. These results obtained are unexpected because as known in the art $C_{gd}$ must generally be increased to increase drive current at the same leakage level.

Thus, adding co-implanted carbon, nitrogen and optional indium at PLDD, and optionally also carbon and/or nitrogen at the halo and carbon, nitrogen and/or indium at the source/drain implants to a boron comprising specie as described herein for PMOS transistors produces more desirable devices by facilitating device scaling and enhancing device performance. For example, as the channel length decreases (e.g., due to device scaling) carrier mobility needs to be increased and/or source/drain resistance (Rsd) needs to be reduced. However, Rsd is limited by sheet resistance (Rsh) in one respect and junction depth (xj) in another respect such that there is a tradeoff between Rsh and xj. In particular, as the channel length is decreased, the junction depth (xj) or depth to which dopants can be implanted is reduced where these shallower implants simultaneously cause an increase in sheet resistance (Rsh) because they effectively act as a thinner resistor. Essentially, adding more dopants to a shallower area does not cause sheet resistance to go down. This is because another limitation, known as active concentration, is reached where no matter how much dopant is implanted, only a certain level of electrical activation can be attained. Beyond a certain (saturation) point there is a limit to how many dopant atoms can be electrically activated, which limits sheet resistance.

As noted above, adding carbon, nitrogen and optionally indium at PLDD to implants of a boron comprising specie as described herein for PLDD has been found to reduce boron diffusion to achieve more abrupt junctions and improves dopant activation levels. More abrupt junctions reduce Cgd and higher activation levels reduce sheet resistance. More abrupt junctions also allow higher dopant levels to be used. Moreover, as described above, for processes including the SMT for NMOS performance enhancement, disclosed embodiments also allow the SMT layer to remain on the PMOS transistors during source/drain annealing without significantly degrading the performance of PMOS transistors that allows elimination extra processing otherwise needed to remove the SMT from the PMOS transistors before source/drain anneal.

In another disclosed embodiment, carbon, nitrogen and optionally indium are implanted globally so that all PMOS transistors (both core and non-core) on the IC receive the co-implant. This embodiment is particularly useful for metal gate PMOS transistors on the IC, such as obtained by replacement gate processing original polysilicon gates. This embodiment is based on the recognition herein that replacement metal gates can eliminate polysilicon depletion effects that lower Toxinv/EOT that can result from applying disclosed co-implants to polysilicon gate core PMOS transistors.

The active circuitry formed on the substrate having a semiconductor surface comprises circuit elements that may generally include transistors, diodes, capacitors, and resistors, as well as signal lines and other electrical conductors that interconnect the various circuit elements to provide an IC circuit function. Disclosed embodiments can be integrated into a variety of process flows to form a variety of devices and related products. The semiconductor substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A method of forming an integrated circuit (IC) including a core PMOS transistor and a non-core PMOS transistor, comprising:

forming over a semiconductor surface of a substrate a non-core gate structure including a gate electrode on a gate dielectric and a core gate structure including a gate electrode on a gate dielectric, wherein said gate dielectric for said non-core gate structure is at least 2 Å of equivalent oxide thickness (EOT) thicker as compared to said gate dielectric for said core gate structure, wherein said gate electrode comprises polysilicon and said gate dielectric for said non-core gate structure comprises a low % nitrogen silicon oxynitride having a nitrogen concentration of at least $1\times10^{19}/cm^3$ at an interface between said polysilicon with said low % nitrogen silicon oxynitride;

performing p-type lightly doped drain (PLDD) implantation including a boron comprising specie to establish source/drain extension regions in said substrate on either side of said non-core and said core gate structure, wherein said PLDD implantation further comprises selective co-implanting carbon, nitrogen and indium into said source/drain extension region of said non-core gate structure, wherein said core gate structure is masked from at least one of said carbon, said nitrogen and said indium implant during said selective co-implanting;

performing source and drain implantation to establish source/drain regions for said non-core and said core gate structure, wherein said source/drain regions are distanced from said non-core and said core gate structures further than their respective source/drain extension regions, and source/drain annealing after said performing source and drain implantation, wherein at least one ultra high temperature (UHT) anneal is included after said selective co-implanting, said UHT anneal providing a peak anneal temperature of between 1050° C. and 1400° C. and an anneal time at said peak temperature ≤10 seconds.

2. The method of claim 1, wherein said gate electrode comprises polysilicon, further comprising stress memorization technique (SMT) processing including deposition of at least one layer of tensile material after said performing source and drain implantation and before said source/drain annealing, wherein said layer of tensile material is on said core and said non-core gate structures during said source/drain annealing.

3. The method of claim 1, wherein said source/drain annealing comprises said UHT anneal, further comprising at least one UHT anneal after said co-implanting and before said performing source and drain implantation.

* * * * *